United States Patent [19]

Vellanki

[11] Patent Number: 5,483,884
[45] Date of Patent: Jan. 16, 1996

[54] METHOD AND APPARATUS FOR SETTING UP A STENCIL PRINTER

[75] Inventor: Mahesh K. Vellanki, Princeton, N.J.

[73] Assignee: AT&T Corp., Murray Hill, N.J.

[21] Appl. No.: 331,462

[22] Filed: Oct. 31, 1994

[51] Int. Cl.$^6$ ............................. B41F 15/26; B41F 15/44
[52] U.S. Cl. ........................ 101/129; 101/123; 101/126
[58] Field of Search .................................. 101/114, 120, 101/123, 126, 129, 157, 169

[56] References Cited

U.S. PATENT DOCUMENTS

| 4,469,022 | 9/1984 | Meador | 101/129 |
| 4,893,556 | 1/1990 | Takahashi et al. | 101/123 |
| 5,174,201 | 12/1992 | Andris et al. | 101/129 |
| 5,245,922 | 9/1993 | Klemm | 101/126 |

FOREIGN PATENT DOCUMENTS

| 44657 | 4/1981 | Japan | 101/126 |
| 14956 | 1/1986 | Japan | 101/129 |
| 114648 | 5/1988 | Japan | 101/123 |
| 63-114649 | 5/1988 | Japan | 101/123 |
| 137843 | 6/1988 | Japan | 101/129 |

*Primary Examiner*—Stephen Funk
*Attorney, Agent, or Firm*—Robert B. Levy

[57] ABSTRACT

A sensor system (56) for measuring various parameters of a stench printer (10) includes a test fixture (58) having a plurality of sensors (64—64 and 68—68) arranged therein. The test fixture (58) is adapted for substitution with a conventional PWB (16) so as to underlie a stencil (26) of the printer to measure the forces on, and the proximity to, the stencil. The force and proximity information from the sensors (64—64 and 68—68) is coupled by an interface unit (70) to a control processor that processes the sensor information to indicate what stench printer parameters, if any, may need adjustment.

7 Claims, 2 Drawing Sheets

METHOD AND APPARATUS FOR SETTING UP A STENCIL PRINTER

TECHNICAL FIELD

This invention relates to a technique for measuring certain parameters associated with a stench printer that prints solder paste, or the like, on a substrate to facilitate setup of the printer.

TECHNICAL FIELD

Electronic components can be solder-bonded to a substrate, such as a printed circuit board, by first depositing a volume of solder paste on each metallized area on the board adapted to receive a component lead. Thereafter, the components are placed on the board with the component leads in contact with the solder paste-coated metallized areas. Following component placement, the solder paste is reflowed to bond the component leads to the metallized areas.

Typically, the solder paste is deposited on the metallized areas on the circuit board by first placing a stench in registration with the board. The stench is usually fabricated from a thin sheet of brass or stainless steel that has a pattern of openings corresponding to the pattern of metallized areas on the circuit board. After the stench has been placed in registration with the circuit board surface, a stench print head is displaced across the stench. The stench print head may include a mechanism for dispensing solder paste on the stench and will always include one or more squeegee blades for forcing the solder paste through the stench openings and onto the circuit board as the print head is displaced across the stencil.

Presently, there is a trend toward greater component density which has resulted in a corresponding reduction in the size and pitch (spacing) of the metallized areas on each circuit board. The reduced size and pitch of the circuit board metallized areas has required that the solder paste be printed on the metallized areas with very high precision to avoid uneven paste deposits. Uneven paste deposits can lead to defects such as shorts or opens after reflow.

Most circuit board fabricators try to maintain tight tolerances during stench printing by adjusting the stench printer to the specifications provided by the printer manufacturer for the particular circuit board being printed. Once the stench printer has been adjusted, no further adjustments are made unless the board size is changed, or unless a defect readily manifests itself. The problem with this approach is that defects too small to manifest themselves can lead to poor quality solder joints.

In Japanese Laid-Open patent application No 63-114649, there is disclosed a device for measuring the forces on the squeegee blade of a stench printer to facilitate printer setup and periodic readjustment. The measuring device consists of a plate having three force sensors therein arranged in a single row for underlying the blade of the stencil print head for measuring the force exerted by the blade. The stencil printer is then adjusted in accordance with the forces measured by the sensors so the blade exerts a near uniform force along its length.

The disadvantage of adjusting the stench printer in this manner is that it takes no account of possible variations in the stencil. Although the stencil may initially be flat, repeated printing operation often leaves the stencil distorted. The application of a uniform force by the blade across a distorted stencil can cause uneven paste deposits.

Thus there is a need for a technique for setting up a stencil printer to take account of variations in the stencil.

BRIEF SUMMARY OF THE INVENTION

Briefly, in accordance with one aspect of the invention, a method is disclosed for setting up a stencil printer that prints solder paste, or the like, on a substrate by dispensing paste onto a stencil and then displacing at least one blade thereacross to force the paste through the stench openings onto the substrate. In accordance with the method of the invention, a test fixture is provided with at least two rows of spaced-apart force sensors, each row running parallel to the direction of travel of the blade across the stencil. The test fixture is substituted for a conventional printed wiring board, and to that end, the test fixture is placed on the printer to underlie the stencil so the force sensors will measure the force exerted thereon. The blade of the stencil printer is displaced across the stench to simulate a stencil printing operation. As the blade is displaced across the stencil, the force sensors measure the force of the blade on the stencil. The forces measured by force sensors are processed to determine what if any adjustments are need to assure optimum stencil printing. For example, if the force exerted on the stencil, as sensed by the force sensors, is uneven, then the stencil print head may be adjusted to obtain a more uniform force measurement.

DETAILED DESCRIPTION

Figure 1:
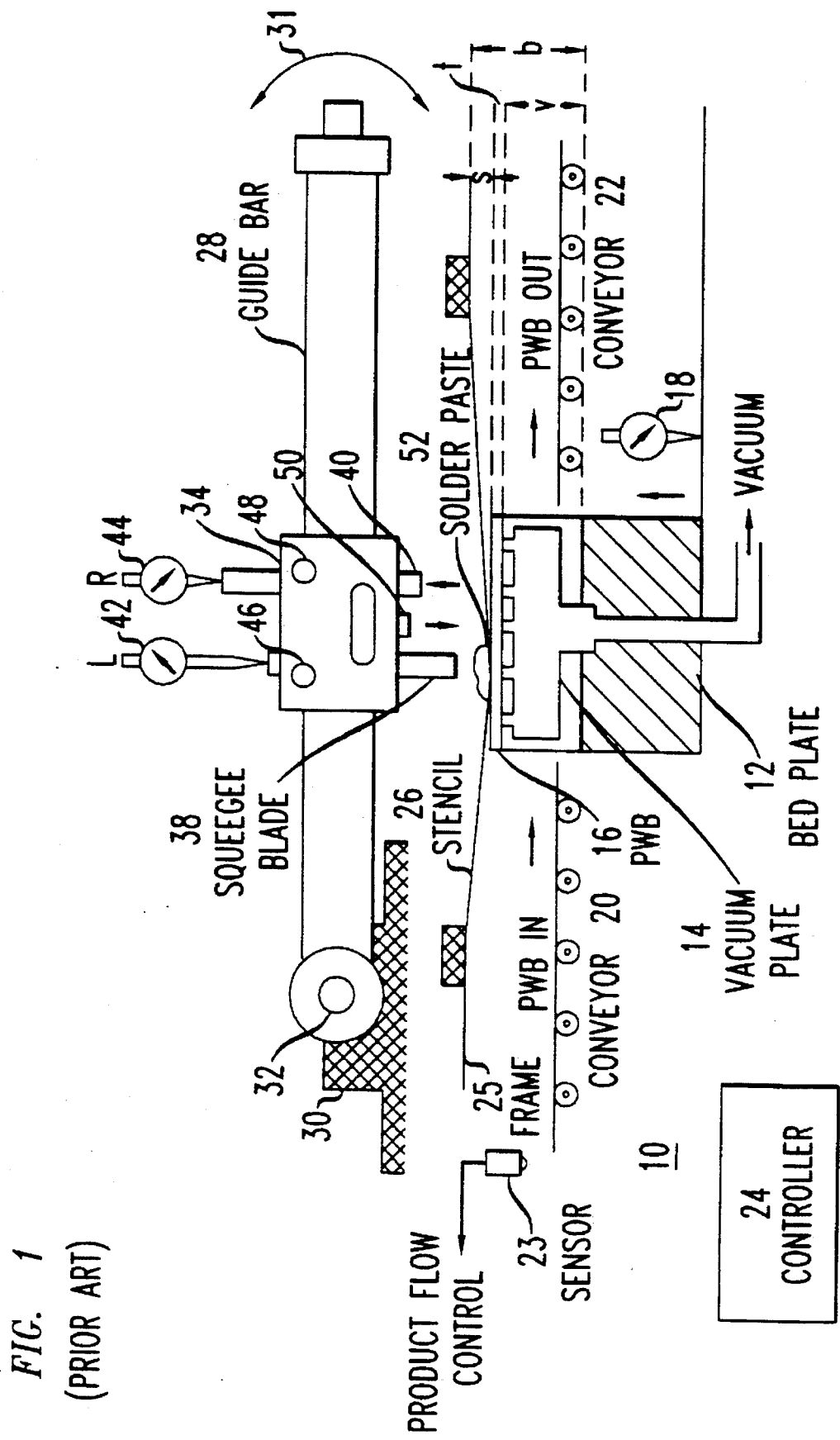
FIG. 1 is a side view in cross section of a stencil printer in accordance with the prior art.

FIG. 1 is a simplified side view of a conventional stencil printer 10 comprising an adjustable height bed plate 12 for supporting a vacuum plate 14 coupled to a source of vacuum (not shown). The vacuum plate 14 functions to support and to hold a Printed Wiring Board (PWB) 16. A bed plate indicator 18 is typically provided for visually indicating the height of the bed plate 12 and for generating an electrical signal that varies with the bed plate height. By adding the height of the bed plate 12 to the height of the vacuum plate 14 and the thickness of the PWB 16, an overall indication can be obtained for the overall height of the PWB.

In the illustrated embodiment, the stencil printer 10 includes a pair of conveyors 20 and 22 located to the left and right, respectively, of the bed plate 12 for transporting the PWB 16 onto and off of, respectively, the vacuum plate 14. A sensor 23, such as a photocell or proximity switch, may be provided adjacent to one or both of the conveyors 20 and 22 to detect the transfer of the PWB 16 onto and off of the vacuum plate 14. The output signal of the sensor 23 is supplied to a controller 24 that controls the overall operation of the stencil printer 10. The controller 24 is provided by the manufacturer of the stencil printer 10.

Overlying the vacuum plate 14 is a frame 25 that releasably secures a stencil 26 in aligned registration with the PWB 16. Although not shown in FIG. 1, the stencil 26 has a plurality of openings, each in aligned registration with an individual one of a plurality of metallized areas (not shown) on the PWB 16. Situated above the frame 25 is a guide bar 28 that is pivotally connected to a support member 30. By virtue of its pivotal mounting to the support member 30, the guide bar 28 can rotate through an arc 31 about an axis 32. The axis 32 is parallel to the plane of the PWB 16.

A stencil print head 34 is slidably mounted to the guide bar 28 for movement along an axis 36 parallel to the plane of the PWB 16 and perpendicular to the axis 32. Means (not shown), typically in the form of a pneumatic or hydraulic cylinder, are provided to reciprocate the stencil print head 34 along the guide bar 28. In the illustrated embodiment, the stencil print head 34 has a pair of spaced-apart squeegee or doctor blades 38 and 40 depending from the lower surface of the print head such that each blade has its longitudinal axis perpendicular to the axis 36. Each of blades 38 and 40 may be extended or retracted while the other is retracted and extended, respectively, by suitable means (not shown) carried by the stencil print head 34. Associated with each of the blades 38 and 40 is a corresponding one of a pair of down stroke indicators 42 and 44. Each of the indicators 42 and 44 provides a visual indication of whether a corresponding one of the blades 38 and 443, respectively, is retracted or extended. Also, each of the indicators 42 and 44 provides an electrical signal indicative of whether a corresponding one of the blades 38 and 40, respectively, is extended or retracted. Like the sensor 23, the fit licators 42 and 44 are coupled to the controller 24. The distance which each of the blades 38 and 40 may extend below the print head 34 is controlled by an individual one of a pair of adjustment screws 46 and 48, respectively. Separate means (not shown) are typically provided for controlling the degree of tilt of the print head 34 to control the degree to which each of the blades 38 and 40 has its longitudinal axis parallel to the axis 32. In the illustrated embodiment, the stench print head 34 has an opening 50 in the bottom thereof between the blades 38 and 40. It is through this opening 50 that a volume of solder paste 52 may be expelled from the print head onto the stench 26 by expulsion means (not shown) within the print head. Note that the stench print head may not necessarily include a mechanism for dispensing the solder paste 52. Rather, the paste 52 may be dispensed manually.

In order to print the solder paste 52 on the PWB 16, the stench printer 10 is readied in the following manner. First the print head 34 is loaded with the right type of paste 52, presuming that 264 the stencil print head contains a paste dispensing mechanism. Thereafter, the conveyors 20 and 22 are adjusted in accordance with the width of the PWB 16, and the vacuum plate 14 is replaced, if necessary, with one of the appropriate size. Also, the appropriate stencil 26 is secured to the frame 25. Next, the controller 24 is loaded with an instruction program appropriate for the particular PWB 16 to be printed. The program may already be present in the controller 24, and thus, it may only be necessary to select the right program. If, however, the program is not present, the program must be down-loaded from a magnetic disc or the like.

Once the foregoing steps have been taken, a sample PWB 16 is loaded onto the vacuum plate 14. Thereafter, the gap S in FIG. 1 between the PWB 16 and the stencil 26 (usually referred to as the "snap-off distance") is adjusted by varying the height b of the bed plate 12, as measured between the top of the bed plate and the frame 25. Usually, there is no definitive measure for the snap-off distance S. Rather, the distance is determined by tapping the stencil 26. Once the snap-off distance S is set, the stencil print head 34 is displaced along the guide bar 28. Depending on the direction of travel, one of the two blades 38 and 40 is extended so it lags the paste 52 dispensed from the outlet 50 as the print head 34 is displaced along the axis 36. In this way, the extended one of the blades 38 and 40 forces the paste 52 through the openings in the stencil 26 and onto the PWB 16.

The height (thickness) of the paste 52 deposited on the PWB 16 in accordance with the foregoing process varies with the pressure exerted by the extended one of the blades 38 and 40. The pressure exerted by each of the blades 38 and 40 is assumed to be directly proportional to the extent to which each blade is extended. As discussed, the extent to which each of the blades 38 and 40 extends can be varied by adjusting a corresponding one of the screws 46 and 48, respectively. To determine the proper adjustment of the screws 46 and 48, several different screw adjustments are made and a sample board is printed for each screw setting. Each printed PWB 16 is then viewed under a microscope (not shown) to observe the height of the paste 52. Once the proper paste height has been measured, the screws 46 and 48 are returned to the setting that yielded the desired paste thickness.

Figure 2:
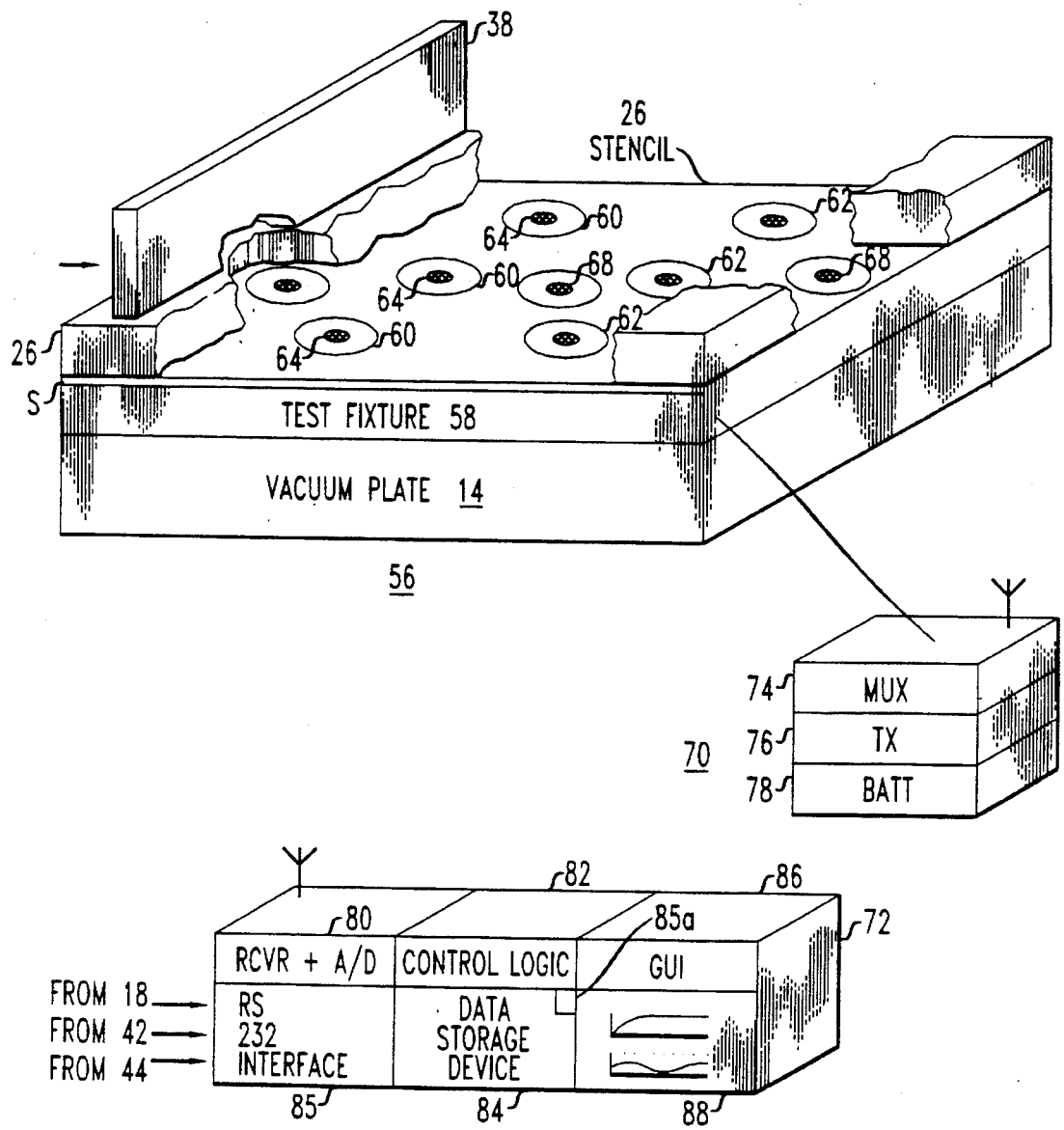
FIG. 2 is perspective view of a system, in accordance with the present invention, for measuring certain parameters of the stench printer of FIG. 1 to facilitate setup of the printer.

As may be appreciated, the above-described setup process is generally carried out by trial and error, yielding results which are less than accurate. Referring now to FIG. 2, there is shown a sensor system 56, in accordance with the present invention, for more accurately measuring various parameters of the stencil printer 10 of FIG. 1 to allow for more accurate setup. The sensor system 56 of FIG. 2 includes a test fixture 58 which is adapted for placement on the vacuum plate 14 of the stencil printer in place of the PWB 16 of FIG. 1 to underlie the stencil 26. Embedded within the test fixture 58 are two spaced-apart rows 60 and 62 of force sensors 64—64. In practice, each of the rows 60 and 62 contains three force sensors 64—64 that are aligned parallel to the longitudinal axis of each squeegee blade (only blade 38 being shown in FIG. 2) for measuring the force exerted on the stencil 26 by each blade.

In addition to the force sensors 64—64, the test fixture 58 includes a single row 66 of proximity sensors 68—68 oriented perpendicular to the force sensor rows 60 and 62. In practice, the proximity sensors 68—68 lie on opposite sides of the middle one of the force sensors 64—64 in the rows 60 and 62. As will become better understood, the proximity sensors 68—68 operate to measure the snap-off distance S defined previously.

The sensors 64—64 and 68—68 are coupled by an interface unit 70 to a control processor 72 that serves to process the information provided by the sensors to compute certain information about the stencil printer 10. In the illustrated environment, the interface unit 70 operates to communicate the information from the sensors 64—64 and 68—68 to the control processor 72 in a wireless fashion. To that end, the interface unit 70 comprises a multiplexer 74 for multiplexing the signals from the sensors 64—64 and 68—68. The sensor signals multiplexer by the multiplexer 74 are supplied to a wireless transmitter 76 of the RF or infrared type for transmitting the multiplexer sensor signals to the control processor 72. In addition to the multiplexer 74 and the transmitter 76, the interface unit includes a power supply, typically in the form of a battery 78, for providing the necessary power for the multiplexer and transmitter.

The control processor 72 typically comprises a personal computer that includes several discrete card (circuits), including a combined receiver and Analog-To-Digital (A/D) converter 80. The combined receiver and A/D converter 80 receives the signals transmitted from the interface 70 and converts them to digital information for receipt by a control logic block 82, that takes the form of a microprocessor and associated logic (not shown). The control logic block 82 is coupled to a data storage device 84, in the form of a fixed magnetic disk drive or the like, that contains at least one stored program 85. In accordance with the stored program 85, the control logic block 82 processes the multiplexer sensor data supplied from the interface unit 70 to determine various operating parameters associated with the stencil printer 10 of FIG. 1. For example, the control logic block 82 may process the output signal of each of the proximity sensors 68—68 to determine the snap-off distance $S_i$ measured at each sensor. The control logic block 82 may also compute the average of the individual snap-off distances measured by the sensors 68—68 to yield an average snap-off distance S. Further, by measuring the elapsed timed (Δt) between passage of the stencil blade 38 over the first row 60 of force sensors 64—64 and over the second row 62, the control logic block 80 may compute the blade velocity($V_b$) from the formula:

$$V_b = d/\Delta t$$

where d is the distance between the sensor rows 60 and 62.

In addition to measuring the snap-off distance S and the blade velocity $V_b$, the control logic block 82 also determines the uniformity of the force exerted on the stencil 26 by each blade by comparing the forces sensed by each sensor 64 in each row to the force sensed by the other sensors in the same row. Under ideal conditions, the sensors 64—64 in each of the rows 60 and 62 should sense approximately the same force. However, even when the stencil print head 34 is adjusted so that each blade nominally exerts an equal force along its length, distortions in the stencil 26 will lead to non-uniform forces on the test fixture plate 58. Under such conditions, the paste printed onto the PWB 16 of FIG. 1 would be uneven, leading to potential defects. As may now be appreciated, the sensor system 56, with its text fixture 58 adapted to underlie the stencil 26, thus advantageously serves to detect the variation in the blade forces, as transmitted through the stencil. Such information is then used to adjust the stencil print head 34 of FIG. 1 to exert a more uniform force, as measured through the stencil, to obtain more uniform paste deposit.

In addition to the receiver and A/D device 80, the control processor 72 may advantageously include an RS 232 interface 85a for coupling signals from the bed plate indicator 18 and from the indicators 42 and 44 to the control logic block 82. Information from these indicators can be combined with the information obtained from the sensors 64—64 and 68—68 to gain a greater knowledge of the operating parameters of the stencil printer 10 of FIG. 1.

Depending on the nature of the stored program 85 controlling its operation, the control logic block 82 can operate to sample and hold the information from the sensors 64—64 and 68—68 to provide a history of the operation of the stencil printer. Alternatively, the control logic block 82 can operate to process the sensor information on a real-time basis to provide "live" data concerning the operation of the stencil printer 10 of FIG. 1. In addition to, or simultaneously with, the "historical" and "live" modes of operation, the control logic block 82 can operate in an "administrative" mode to provide information regarding the specified stencil printer parameters and the differences, if any, as compared to the actually measured parameters.

The control processor 72 further includes a graphical user interface 86 for interfacing the control logic block 82 to a display 88 (e.g. a video monitor or the like). The display 88 may display information in numerical format, or as shown in FIG. 2, may display the information computed by the control logic block 82 in a graphical form. In this way a user can observe the results computed by the control logic block 82 during the administrative, live or historic operating modes.

The foregoing discloses a technique for more precisely measuring certain parameters of a stencil printer to allow for more accurate printer setup.

It is to be understood that the above-described embodiments are merely illustrative of the principles of the invention. Various modifications and changes may be made thereto by those skilled in the art which will embody the principles of the invention and fall within the spirit and scope thereof.

What is claimed is:

1. A method for setting up a stencil printer that prints solder paste or the like on a substrate by displacing a blade in a first direction across a stencil in registration with the substrate, comprising the steps of:

providing a test fixture having at least two spaced-apart rows of individual force sensors, each row of force sensors being parallel to the blade and perpendicular to the first direction, and at least one row of spaced-apart proximity sensors parallel to the first direction for measuring the proximity of the stencil to the test fixture;

placing the stencil in registration with the test fixture;

displacing the blade across the stencil to simulate a stencil printing operation so that the blade exerts a force on the stencil;

measuring the force exerted on the stencil by the force sensors of the test fixture;

measuring the proximity measured by each proximity sensor:

processing the forces measured by the force sensors and the proximity measured by each proximity sensor to determine what if any adjustments are necessary to the stencil printer.

2. The method according to claim 1 wherein the forces are processed by comparing the force measured by each force sensor to the force measured by every other sensor to determine if a uniform force is being applied to the stencil.

3. The method according to claim 3 wherein the proximities measured by the proximity sensors are averaged to obtain an average value for the distance between the test fixture and the stencil.

4. A sensor system for use with a stencil printer that prints solder paste or the like on a substrate by displacing a blade in a first direction across a stencil in registration with the substrate, the sensor system comprising:

a test fixture for placement on the stencil printer in place of the substrate to underlie the stencil, the test fixture including two spaced-apart rows of force sensors running parallel to the blade and perpendicular to the first direction for measuring the forces exerted on the stencil and for generating signals indicative of such forces, the test fixture also including at least one row of spaced-apart proximity sensors parallel to the first direction for measuring the distance between the test fixture and the stencil and for generating signals indicative of such distance;

an interface unit transmitting information obtained from the force sensors indicative of the forces exerted on the stencil and for transmitting information from the proximity sensors indicative of the distance between the stencil and the test fixture; and a control processor responsive to the information transmitted by the interface unit for processing the information to indicate what if any adjustments to the stencil printer are necessary.

5. The apparatus according to claim 4 wherein the interface unit comprises:
- a multiplexer for multiplexing the signals from the force sensors to yield force information;
- a transmitter coupled to the multiplexer for wireless transmission of the force information generated by the multiplexer; and
- a power supply for powering the multiplexer and transmitter.

6. The apparatus according to claim 4 wherein the control processor comprises:
- a receiver and analog-to-digital converter for receiving the information from the interface unit and for converting such information into digital form;
- a data storage device for storing at least one stored program; and
- a control logic block for executing the stored program in the data storage device and processing the force information in digital form to determine what adjustments are necessary.

7. The apparatus according to claim 6 wherein the control processor further includes:
- a display for displaying information from the control logic block; and
- a graphical user interface for interfacing the control logic block to the display.

\* \* \* \* \*